United States Patent
Hsu et al.

(10) Patent No.: US 7,984,409 B2
(45) Date of Patent: Jul. 19, 2011

(54) STRUCTURES INCORPORATING INTERCONNECT STRUCTURES WITH IMPROVED ELECTROMIGRATION RESISTANCE

(75) Inventors: Louis Lu-Chen Hsu, Fishkill, NY (US); Jack Allan Mandelman, Flat Rock, NC (US); William Robert Tonti, Essex Junction, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 11/875,193

(22) Filed: Oct. 19, 2007

(65) Prior Publication Data
US 2008/0120580 A1    May 22, 2008

Related U.S. Application Data

(63) Continuation-in-part of application No. 11/562,550, filed on Nov. 22, 2006, now Pat. No. 7,666,781.

(51) Int. Cl.
*G06F 17/50* (2006.01)
*H01L 23/48* (2006.01)
*H01L 23/52* (2006.01)
*H01L 29/40* (2006.01)

(52) U.S. Cl. .................. 716/119; 257/758

(58) Field of Classification Search .......... 716/11, 716/119; 257/758
See application file for complete search history.

(56) References Cited

U.S. PATENT DOCUMENTS

| | | | |
|---|---|---|---|
| 5,098,860 A | 3/1992 | Chakravorty et al. | |
| 5,897,370 A * | 4/1999 | Joshi et al. | 438/632 |
| 5,930,669 A | 7/1999 | Uzoh | |
| 5,933,753 A | 8/1999 | Simon et al. | |
| 6,383,920 B1 | 5/2002 | Wang et al. | |
| 6,429,519 B1 | 8/2002 | Uzoh | |
| 6,713,835 B1 * | 3/2004 | Horak et al. | 257/522 |
| 6,890,828 B2 * | 5/2005 | Horak et al. | 438/319 |
| 2002/0098681 A1 * | 7/2002 | Hu et al. | 438/626 |
| 2002/0171147 A1 * | 11/2002 | Yew et al. | 257/751 |
| 2003/0116439 A1 * | 6/2003 | Seo et al. | 205/125 |
| 2003/0125925 A1 * | 7/2003 | Walther et al. | 703/22 |
| 2004/0113235 A1 * | 6/2004 | Coolbaugh et al. | 257/532 |
| 2004/0115921 A1 * | 6/2004 | Clevenger et al. | 438/622 |
| 2004/0115928 A1 * | 6/2004 | Malhotra et al. | 438/639 |
| 2005/0032352 A1 | 2/2005 | Farrar | |

(Continued)

OTHER PUBLICATIONS

US Patent and Trademark Office, Office Action issued in related U.S. Appl. No. 11/562,550 dated Mar. 12, 2009 (6 pages).

(Continued)

*Primary Examiner* — Suresh Memula
*Assistant Examiner* — Vuthe Siek
(74) *Attorney, Agent, or Firm* — Wood, Herron & Evans, LLP

(57) ABSTRACT

Design structure embodied in a machine readable medium for designing, manufacturing, or testing a design. The design structure comprises an insulating layer of a dielectric material, an opening having sidewalls extending from a top surface of the insulating layer toward a bottom surface of the insulating layer, and a conductive feature disposed in the opening. The design structure includes a top capping layer disposed on at least a top surface of the conductive feature and a conductive liner layer disposed between the insulating layer and the conductive feature along at least the sidewalls of the opening. The conductive liner layer of the design structure has sidewall portions that project above the top surface of the insulating layer adjacent to the sidewalls of the opening.

18 Claims, 7 Drawing Sheets

U.S. PATENT DOCUMENTS

| | | | |
|---|---|---|---|
| 2005/0056616 A1 | 3/2005 | Cooper et al. | |
| 2006/0202345 A1* | 9/2006 | Barth et al. | 257/761 |
| 2006/0234443 A1* | 10/2006 | Yang et al. | 438/253 |
| 2006/0246718 A1* | 11/2006 | Frohberg et al. | 438/638 |
| 2007/0157140 A1* | 7/2007 | Holesovsky et al. | 716/5 |
| 2008/0102599 A1 | 5/2008 | Yang | |
| 2008/0116576 A1* | 5/2008 | Moon et al. | 257/751 |
| 2008/0122090 A1* | 5/2008 | Hsu et al. | 257/746 |
| 2008/0166870 A1* | 7/2008 | Huang et al. | 438/619 |

OTHER PUBLICATIONS

Office Action issued in a related U.S. Appl. No. 11/562,550; dated as mailed on Oct. 10, 2008; 10 pages; U.S. Patent and Trademark Office.

Gopal Raghavan et al., "Diffusion of copper through dielectric films under bias temperature stress," 1995 Elsevier Science S. A., pp. 168-176.

Junji Noguchi et al., "Impact of Low-K Dielectrics and Barrier Metals on TDDB Lifetime on Cu Interconnects," IEEE 39th Annual International Reliability Physics Symposium, Orlando, Florida, 2001, pp. 355-359.

Junji Noguchi et al., "Cu-Ion-Migration Phenomena and its Influence on TDDB Lifetime in Cu Metallization," IEEE 41st Annual International Reliability Physics Symposium, Dallas, Texas, 2003, pp. 287-292.

USPTO, Notice of Allowance issued in related U.S. Appl. No. 11/562,550 dated Oct. 8, 2009.

* cited by examiner

STRUCTURES INCORPORATING INTERCONNECT STRUCTURES WITH IMPROVED ELECTROMIGRATION RESISTANCE

CROSS-REFERENCE TO RELATED APPLICATIONS

This application is a continuation-in-part of application Ser. No. 11/562,550, filed Nov. 22, 2006, which is hereby incorporated by reference herein in its entirety.

FIELD OF THE INVENTION

The invention relates generally to the fabrication of integrated circuits and, in particular, to design structures integrating interconnect structures for integrated circuits.

BACKGROUND OF THE INVENTION

Back end of line (BEOL) interconnect structures have been developed that complement the progressive scaling of the feature sizes and critical dimensions of semiconductor devices and integrated circuits. In a typical multilevel interconnect structure, two or more separate levels of conductive lines extend laterally across a substrate carrying the integrated circuit. Insulating layers of dielectric material separate and electrically isolate conductive lines in adjacent levels. Conductive contacts extend through vias in the insulating layers to connect conductive lines in adjacent levels.

The conductive lines and contacts of the BEOL interconnect structure cooperate to distribute signals among the devices and integrated circuits on the substrate. The conductive lines of the first metallization, which are in the initial level of the interconnect structure nearest to the substrate, primarily interconnect the devices of the integrated circuit and may optionally provide circuit-to-circuit connections. The conductive lines in the upper levels of the interconnect structure complete the circuit-to-circuit connections and establish contacts with input and output terminals. Despite advanced designs that more effectively route signal paths of the integrated circuit, the signal-transmission effectiveness and efficiency of the interconnect structure may eventually limit the ultimate performance of the integrated circuit.

BEOL interconnect structures exhibit an intrinsic signal propagation delay dependent upon the resistance of the interconnect lines and contacts and also upon the capacitance of the dielectric materials in which the conductive lines and contacts are embedded. Forming conductive lines and contacts from copper (Cu) has been found to reduce the resistance contribution to the signal propagation delay. The capacitance contribution to the signal propagation delay may be reduced by using low dielectric constant (low-k) dielectrics having a dielectric constant, k, of about 3.9 or less. As feature sizes and critical dimensions are scaled below 90 nm, the combination of copper metal and low-k dielectric materials has been demonstrated to minimize signal propagation delay particularly well.

Copper-dielectric BEOL interconnect structures are routinely fabricated by damascene processes. In single damascene processes, vias are selectively etched in a dielectric layer masked by a patterned resist. After the resist is stripped, metal is deposited to fill the vias and to establish contacts with underlying conductor lines or other conductive structures. Trenches are then etched in another patterned layer of dielectric material deposited on the initial dielectric layer and subsequently filled with deposited metal to define overlying conductive lines. The conductive lines in adjacent levels of the interconnect structure are electrically coupled by the contacts. Dual-damascene processes differ in that the trenches and vias are etched in one or more layers of insulating or dielectric material and then filled simultaneously by a single blanket deposition of metal. Repeating these damascene processes forms subsequent levels of the interconnect structure.

Conventional copper-dielectric BEOL interconnect structures include a conductive liner situated between the dielectric material and the conductive lines and contacts. In particular, the use of copper metal in interconnect manufacture requires an adhesion layer between the copper metal and the dielectric material to promote bonding and a diffusion barrier between the copper metal and the dielectric material to isolate the copper from the dielectric material. Liners, such as a bilayer of TaN/Ta, have proven to be effective for copper interconnects by isolating the conductive copper metal from the bordering low-k dielectric material as well as strongly bonding the copper metal and the dielectric material. The liner covers the bottom and sidewalls of the trench bearing the conductive line.

Migration of metals, such as copper, from conductive features of the BEOL interconnect structure into the nearby dielectric material may compromise the integrity of the insulating layers. In particular, metal contamination of the dielectric material may promote significant leakage currents among the interconnect levels. Furthermore, electromigration induced by electron flow during normal circuit operation may cause mass transport of the conductor in the interconnect structure in the direction of the electron flow and at a rate determined by the current density. The mass depletion arising from electromigration may eventually result in thinned conductive lines characterized by increased resistivity.

Electromigration may be reduced in BEOL interconnect structures that rely on aluminum metal for conductive lines and contacts by adding a small amount of an appropriate dopant to the aluminum metal. The electromigration of aluminum is recognized as occurring by a bulk transport mechanism that the presence of the dopant mitigates. On the other hand, the electromigration of copper is recognized to primarily occur by a surface transport mechanism, which cannot be satisfactorily mitigated by merely introducing a bulk dopant. As feature sizes and critical dimensions are scaled below 90 nm, the reliability of copper-based interconnect structures may be particularly prone to compromise by electromigration.

In conventional copper-based BEOL interconnect structures, the top surface of the conductive line is often covered by a dielectric capping layer, such as silicon nitride. Because electromigration occurs by a surface transport mechanism in copper-based interconnect structures, the resulting mass transport of copper primarily occurs at interfaces between copper and the contacting material, such as the interface between the conductive line and the dielectric capping layer. In the latter instance, the escaping copper diffuses or migrates along the interface between the dielectric capping layer and the underlying insulating layer of the interconnect level. As the distance between adjacent interconnect levels is reduced, the mobility of copper metal contamination along this interface significantly increases the risk of dielectric breakdown and leakage.

Conventional copper-based BEOL interconnect structures may also rely on metal capping layers applied to the top surface of the conductive line as a substitute for dielectric capping layers. Selective deposition techniques have been developed that are capable of forming metal capping layers on the top surface of the conductive lines, but not on the top surface of the surrounding dielectric material. However, even such selective deposition processes may leave unwanted metal residues on the insulating layer because the deposition selectivity is not perfect. Moreover, the selectively-deposited metal capping layer is only coextensive with the underlying conductive line, which leaves an open interface at the peripheral edge of the capping layer.

Metal contamination of the dielectric material in the insulating layer of the BEOL interconnect structure may also originate from artifacts of the damascene process. Specifically, damascene processes fill the trenches and vias with conductor originating from a blanket deposition of metal. A planarization process, such as chemical-mechanical polishing (CMP), removes excess metal covering the top surface of the insulating layer. After planarization, metal residues on the insulating layer represent another potential contamination source for the constituent dielectric material.

What is needed, therefore, are design structures with interconnect structures configured to reduce or eliminate the electromigration of the constituent conductive material, such as copper, from conductive features into the surrounding insulating layer.

SUMMARY OF THE INVENTION

An embodiment of the invention is directed to an interconnect structure that includes an insulating layer of a dielectric material having a top surface and a bottom surface between the top surface and a substrate. An opening, such as a trench, has sidewalls extending from the top surface of the insulating layer toward the bottom surface. A conductive feature, which has a top surface, is disposed in the opening. A first capping layer is disposed on at least the top surface of the conductive feature. A conductive liner layer is disposed between the insulating layer and the conductive feature along at least the sidewalls of the opening. The conductive liner layer has sidewall portions projecting above the top surface of the insulating layer adjacent to the sidewalls of the opening.

In another embodiment of the invention, a method of forming an interconnect structure includes forming an opening, such as a trench, in a layer stack comprising an insulating layer having a bottom surface overlying the substrate and a sacrificial layer on a top surface of the insulating layer. Deposited on sidewalls of the opening is a liner layer, which has sidewall portions that are bounded by the sacrificial layer. The method further comprises removing the sacrificial layer so that the sidewall portions of the liner layer project above the top surface of the insulating layer. A conductive feature, which is deposited in the trench, is separated from the insulating layer by the liner layer. The method further comprises depositing a capping layer on at least a top surface of the conductive feature.

In another embodiment of the invention, a method of forming an interconnect structure includes forming an opening, such as a trench, in an insulating layer and depositing a liner layer on sidewalls of the opening. The method further comprises recessing a top surface of the insulating layer relative to the liner layer such that sidewall portions of the liner layer project above the top surface of the insulating layer. The method further comprises depositing a conductive feature in the opening separated from the insulating layer by the liner layer, and selectively depositing a conductive capping layer on a top surface of the conductive feature.

A design structure embodied in a machine readable medium is provided for designing, manufacturing, or testing a design. The design structure comprises an insulating layer of a dielectric material, an opening having sidewalls extending from a top surface of the insulating layer toward a bottom surface of the insulating layer, and a conductive feature disposed in the opening. The design structure includes a top capping layer disposed on at least a top surface of the conductive feature and a conductive liner layer disposed between the insulating layer and the conductive feature along at least the sidewalls of the opening. The conductive liner layer of the design structure has sidewall portions that project above the top surface of the insulating layer adjacent to the sidewalls of the opening.

The design structure may comprise a netlist, which describes the design. The design structure may reside on storage medium as a data format used for the exchange of layout data of integrated circuits. The design structure may include at least one of test data files, characterization data, verification data, or design specifications.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
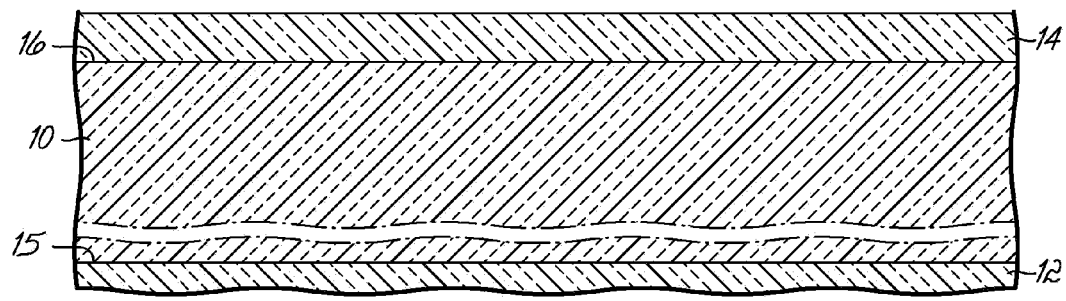
FIGS. 1-6 are diagrammatic cross-sectional views of a portion of a substrate at successive fabrication stages of a processing method in accordance with an embodiment of the invention.

With reference to FIG. 1, an insulating layer 10 is deposited on a top surface 15 of an underlying substrate 12. Substrate 12 may include various circuits and/or devices (not shown) formed thereon and/or therein that may be interconnected by conductive features formed in the insulating layer 10 to define an interconnect level of an interconnect structure. The conductive features may interconnect devices of an integrated circuit, and may provide circuit-to-circuit connections, or may establish contact with input and output terminals. Substrate 12 may also comprise an underlying interconnect level of a multi-level interconnect structure that includes only other conductive features embedded in an insulating layer of dielectric material.

The insulating layer 10 comprises a dielectric material deposited by a conventional method, such as a spin-on application, understood by a person having ordinary skill in the art. The dielectric material constituting insulating layer 10 may be characterized by a relative permittivity or dielectric constant smaller than the dielectric constant of silicon dioxide, which is about 3.9. Alternatively, the dielectric material may be characterized by a dielectric constant of about 3.0 or less. Fabricating the insulating layer 10 from such low-k materials may operate to lower the capacitance of the completed interconnect structure as understood by a person having ordinary skill in the art. The thickness of the insulating layer 10 may range from about 50 nm to about 1,000 nm.

Candidate low-k dielectric materials for insulating layer 10 include, but are not limited to, porous and nonporous spin-on organic low-k dielectrics, porous and nonporous inorganic low-k dielectrics, such as organosilicate glasses, and combinations of organic and inorganic dielectrics. A particularly suitable organic low-k dielectric for use in insulating layer 10 may be the spin-on aromatic thermoset polymer SiLK commercially available from Dow Chemical Co. (Midland, Mich.) and having a dielectric constant of about 2.6 if nonporous and about 2.2 if porous. A particularly suitable inorganic low-k dielectric for use in insulating layer 10 may be hydrogen-enriched silicon oxycarbide (SiCOH) deposited, for example, by a deposition recipe based on, for example, plasma enhanced chemical vapor deposition (PECVD) and having a dielectric constant of about 3.0 or less. The composition and properties of SiCOH may vary depending on the deposition conditions and source gases.

A sacrificial layer 14 is formed on a top surface 16 of the insulating layer 10. The sacrificial layer 14 may be composed of a dielectric material including, but not limited to, silicon dioxide ($SiO_2$), silicon nitride ($Si_3N_4$), silicon carbide (SiC), or combinations thereof. The thickness of the sacrificial layer 14 may range from about 10 nm to about 80 nm.

Figure 2:
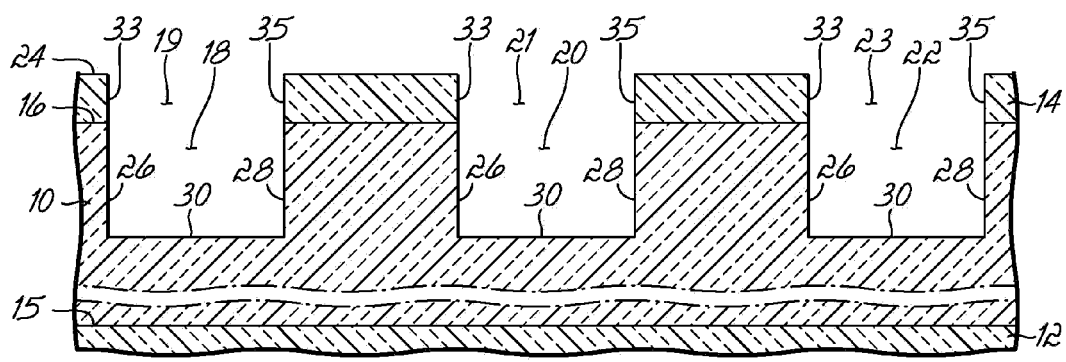

With reference to FIG. 2 in which like reference numerals refer to like features in FIG. 1 and at a subsequent fabrication stage, features represented by troughs or trenches, of which trenches 18, 20, 22 are representative, are formed in the insulating layer 10 using a conventional lithography and etch operation. To that end, a resist layer (not shown) is applied to cover a top surface 24 of sacrificial layer 14, exposed to impart a latent image pattern characteristic of trenches 18, 20, 22, and developed to transform the latent image pattern into a final image pattern having unmasked areas at the future locations of trenches 18, 20, 22. Volumes of the unmasked sacrificial layer 14 and insulating layer 10 are removed by an etching process, such as plasma etching or reactive ion etching (RIE), capable of producing substantially vertical sidewalls in the insulating layer 10 and sacrificial layer 14. After the etching process concludes, residual resist is stripped by, for example, plasma ashing or a chemical stripper.

Trench 18 includes sidewalls 26, 28 that extend substantially vertically in the insulating layer 10 from the top surface 16 to a bottom surface 30 located at a horizontal level or depth intermediate between the top surface 16 and the top surface 15 of substrate 12. Trenches 20, 22 are characterized by sidewalls similar to sidewalls 26, 28 and a bottom surface similar to bottom surface 30. Additional features (not shown), such as vias, may be formed in the insulating layer 10 that extend, for example, from the bottom surface 30 of trench 18 to the top surface 15 of substrate 12. Openings 19, 21, 23 in the sacrificial layer 14 are registered with the trenches 18, 20, 22. Each of the openings 19, 21, 23 is characterized by sidewalls 33, 35 that are aligned with the sidewalls 26, 28 of the respective one of the trenches 18, 20, 22.

Figure 3:
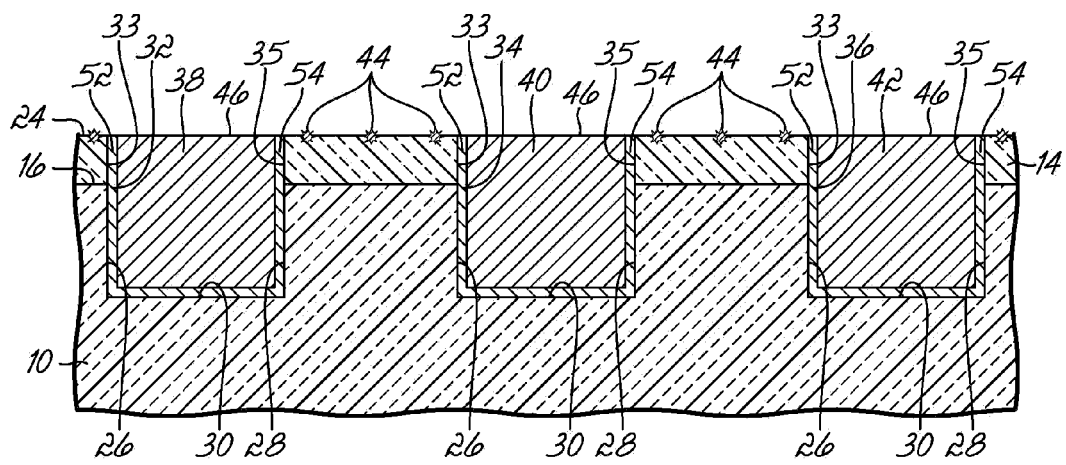

With reference to FIG. 3 in which like reference numerals refer to like features in FIG. 2 and at a subsequent fabrication stage, the sidewalls 26, 28 and bottom surface 30 of trenches 18, 20, 22 are lined with liner layers 32, 34, 36, respectively. Each of the liner layers 32, 34, 36 includes sidewall portions 52, 54 that cover sidewalls 33, 35 of each of the openings 19, 21, 23 in the sacrificial layer 14, respectively. Exemplary materials for liner layers 32, 34, 36 include, but are not limited to, titanium nitride (TiN), tantalum nitride (TaN), titanium (Ti), ruthenium (Ru), a tantalum-ruthenium alloy (TaRu), tungsten (W), tungsten nitride (WN), chromium (Cr), niobium (Nb), and other like materials with properties suitable to operate, at the least, as a diffusion barrier and adhesion promoter. The material constituting liner layers 32, 34, 36 may be formed utilizing conventional deposition processes familiar to a person having ordinary skill in the art, including but not limited to physical vapor deposition (PVD), ionized-PVD (iPVD), atomic layer deposition (ALD), plasma-assisted ALD, chemical vapor deposition (CVD), and PECVD.

Conductive lines 38, 40, 42 are formed in the open volume inside the trenches 18, 20, 22, respectively. Conductive lines 38, 40, 42 are composed of a conductor such as copper (Cu), aluminum (Al), tungsten (W), silver (Ag), alloys of these metals, and other similar metals. These conductors may be deposited by conventional deposition processes, such as CVD, plasma-enhanced CVD, an electrochemical process such as electroplating or electroless plating, chemical solution deposition, PVD, direct current (DC) sputtering, radio frequency (RF) sputtering, and the like. A thin seed layer (not shown) may be deposited in each of the trenches 18, 20, 22 to facilitate the formation of the conductive lines 38, 40, 42. A chemical-mechanical polishing (CMP) process is used to remove excess conductor from the field of sacrificial layer 14 and to planarize a top surface 46 of each of the conductive lines 38, 40, 42 with the top surface 24 of sacrificial layer 14. Residual amounts 44 of the conductor may remain in and/or on the sacrificial layer 14.

Figure 4:
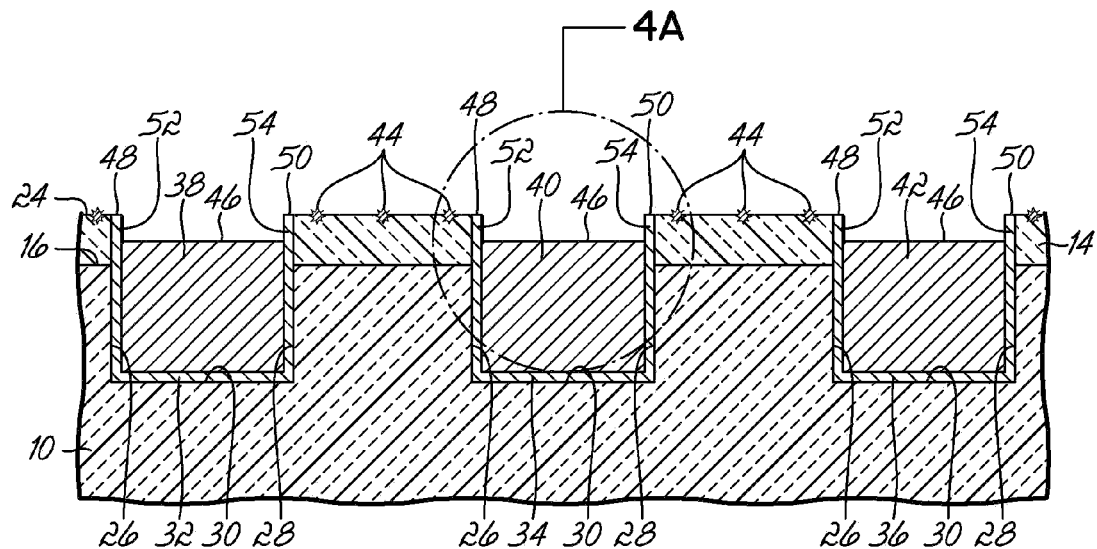
Figure 4A:
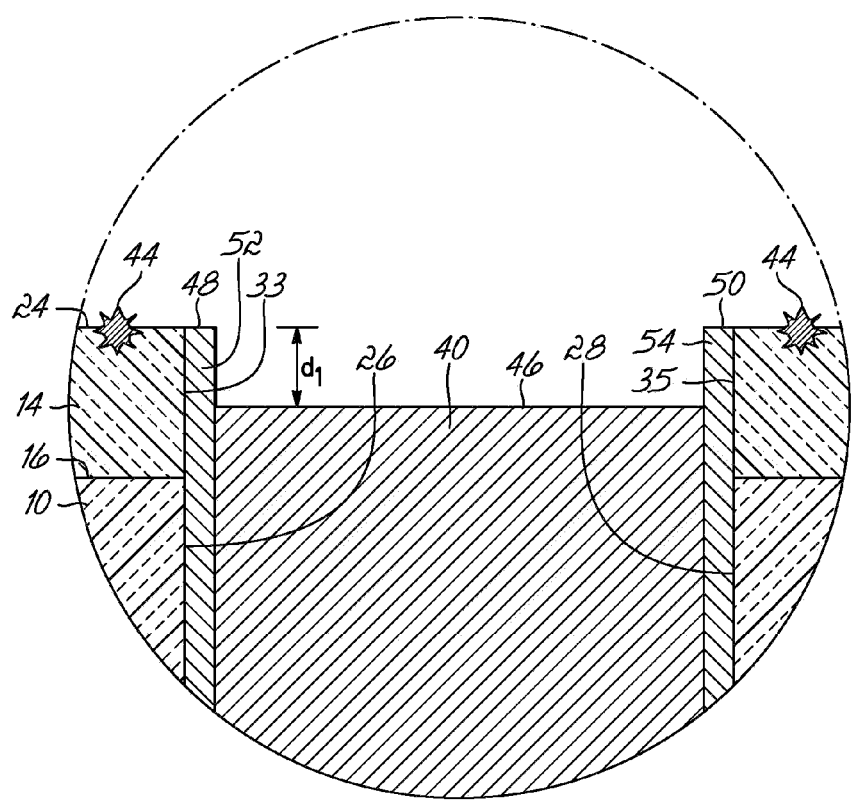
FIGS. 4A and 5A are enlarged detailed views of portions of FIGS. 4 and 5, respectively.

With reference to FIGS. 4 and 4A in which like reference numerals refer to like features in FIG. 3 and at a subsequent fabrication stage, the conductive lines 38, 40, 42 are recessed relative to the top surface 24 of sacrificial layer 14. Specifically, the top surface 46 of each of the conductive lines 38, 40, 42 is recessed below the top surface 24 of sacrificial layer 14. A wet etching process may be used to recess the conductive lines 38, 40, 42 selective to the material of the sacrificial layer 14 and selective to the material(s) of the liner layers 32, 34, 36. The etchant for the wet etching process may include, for example, nitric acid ($HNO_3$), hydrochloric acid (HCl), sulfuric acid ($H_2SO_4$), hydrofluoric acid (HF), or combinations of these acids. If the conductive lines 38, 40, 42 are composed of copper or a copper alloy, a wet etching process may be used, such as the wet etching process disclosed in commonly-assigned application Ser. No. 10/664,017, which published on Mar. 17, 2005 as Publication No. 2005/0056616. The disclosure of this published application is hereby incorporated by reference herein in its entirety. Alternatively, dry etching techniques, such as plasma etching or RIE utilizing an appropriate etch chemistry and recipe, may also be used to recess the top surface 46 of each of the conductive lines 38, 40, 42 below the top surface 24 of sacrificial layer 14.

After etching concludes, the top surface 46 of each of the conductive lines 38, 40, 42 is recessed relative to top edges 48, 50 of respective sidewall portions 52, 54 of the corresponding one of the liner layers 32, 34, 36. As a result, the top edges 48, 50 project a height or distance, $d_1$, above the top surface 46. The distance, $d_1$, may range from about 0.5 nm to about 50 nm above the top surface 46 of each of the conductive lines 38, 40, 42. The sidewall portions 52, 54 of each of the liner layers 32, 34, 36 remain bounded by the sacrificial layer 14. The top surface 46 of each of the conductive lines 38, 40, 42 is effectively recessed toward the bottom surface 30 of the respective one of the trenches 18, 20, 22.

Figure 5:
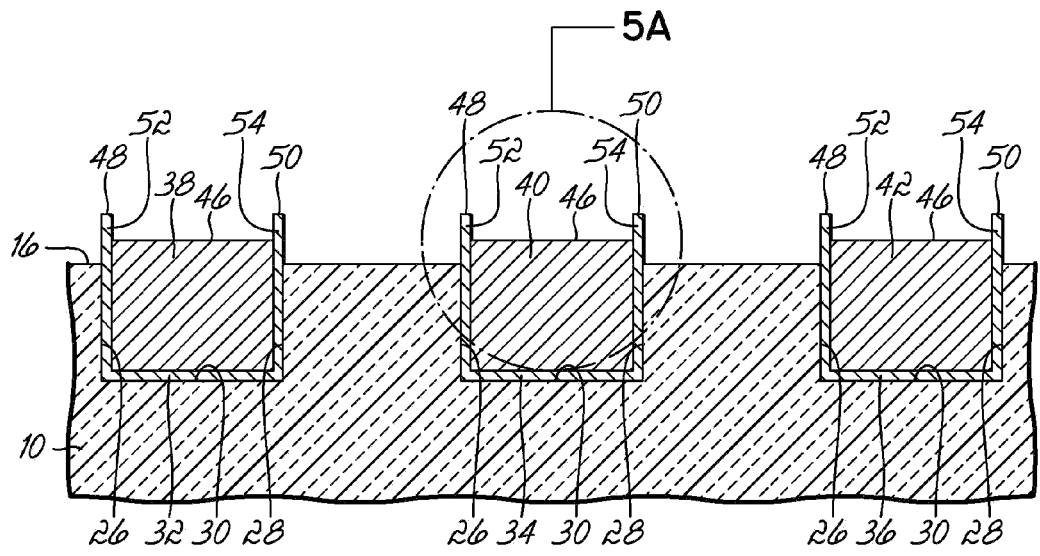
Figure 5A:
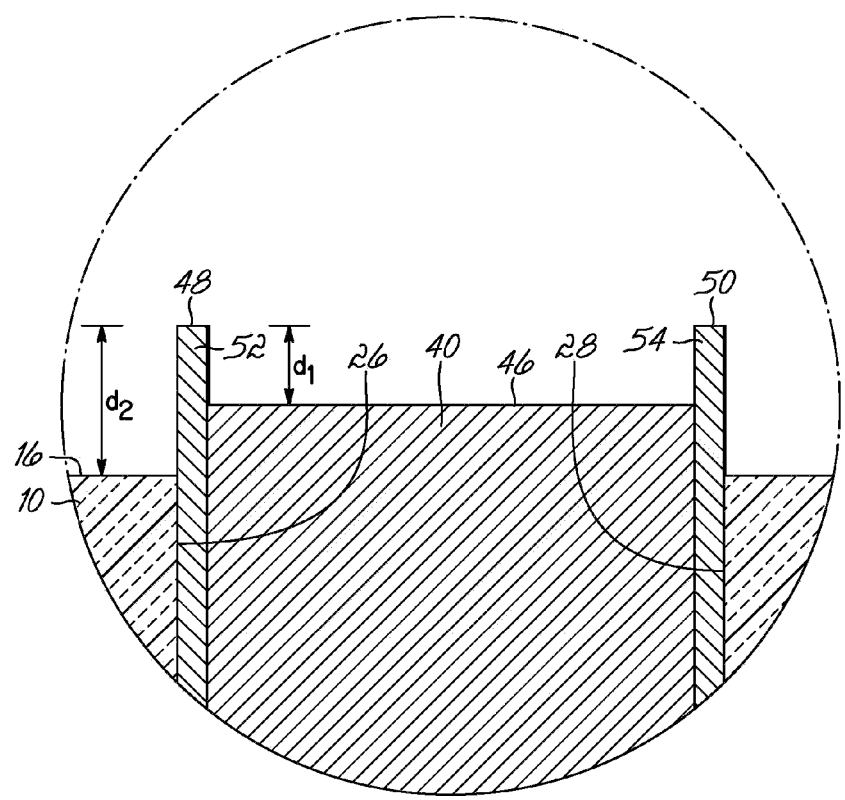

With reference to FIGS. 5 and 5A in which like reference numerals refer to like features in FIGS. 4 and 4A and at a subsequent fabrication stage, the sacrificial layer 14 is removed by, for example, a dilute wet etch process using a HF solution to expose the top surface 16 of the insulating layer 10. The wet etch process removes the material constituting the sacrificial layer 14 selective to the dielectric material constituting the insulating layer 10 and selective to the material(s) of the liner layers 32, 34, 36 and conductive lines 38, 40, 42. Advantageously, the residual amounts 44 of the conductor used to form the conductive lines 38, 40, 42 may be removed concurrently along with the sacrificial layer 14.

The top edges 48, 50 of the sidewall portions 52, 54 of each of the liner layers 32, 34, 36 project a distance, $d_2$, above the top surface 16 of insulating layer 10. Consequently, the top edges 48, 50 of the sidewall portions 52, 54 of each of the liner layers 32, 34, 36 are non-planar relative to the top surface 16, as well as the top surface 46 of each of the conductive lines 38, 40, 42. The top surface 46 of each of the conductive lines 38, 40, 42 is depicted as being located at a level above the top surface 16 of insulating layer 10, although the invention is not so limited. The sidewall portions 52, 54 of liner layers 32, 34, 36, which have the projecting top edges 48, 50, extend about the entire perimeter of conductive lines 38, 40, 42, respectively, as understood by a person having ordinary skill in the art. In an alternative embodiment, a portion of the sacrificial layer 14 may remain on the insulating layer 10 if the interconnect level construction can tolerate the presence of this residual material.

Figure 6:
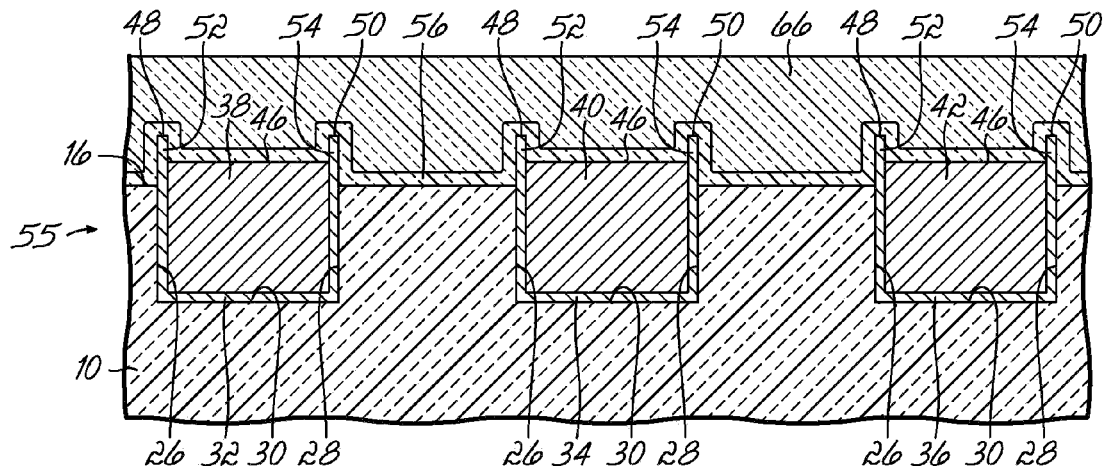

With reference to FIG. 6 in which like reference numerals refer to like features in FIG. 5 and at a subsequent fabrication stage, a capping layer 56, which may comprise a conformal film of a dielectric material such as silicon nitride ($Si_3N_4$), silicon carbide (SiC), or SiC(N,H), is formed on the top surface 16 of the insulating layer 10 and on the top surface 46 of the conductive lines 38, 40, 42. The thickness of the capping layer 56 may range from about 5 nm to about 100 nm. The capping layer 56 operates to form a seal that reduces the likelihood that conductor from the conductive lines 38, 40, 42 can diffuse into the dielectric material constituting insulating layer 10 and, thereby, contaminate the constituent dielectric material.

An interconnect level, generally indicated by reference numeral 55, is defined that includes at least the insulating layer 10 and the conductive lines 38, 40, 42 embedded in insulating layer 10. The projection of the top edges 48, 50 of the sidewall portions 52, 54 of each of the liner layers 32, 34, 36 above the top surface 16 of insulating layer 10 and the top surface 46 of the conductive lines 38, 40, 42 cooperates with the conformal film coverage of the capping layer 56 to eliminate planar interfaces found in conventional damascene interconnect structures that are susceptible to electromigration. In other words, the capping layer 56 and the projection of the top edges 48, 50 of the sidewall portions 52, 54 of each of the liner layers 32, 34, 36 above the top surface 16 of insulating layer 10 and above the top surface 46 of the conductive lines 38, 40, 42 cooperate to increase the electromigration resistance of the conductive lines 38, 40, 42. Another insulating layer 66, which may be composed of the same dielectric materials as insulating layer 10, is subsequently deposited that covers insulating layer 10 and that may participate in fabricating another interconnect level overlying interconnect level 55.

The completed interconnect level 55 may be reproduced or replicated across the surface of substrate 12 by the fabrication procedure described in FIGS. 1-6. Additional interconnect levels, each similar or identical to the completed interconnect level 55, may be stacked above the completed interconnect level 55 by following a fabrication process identical or similar to that illustrated in FIGS. 1-6.

Figure 7:
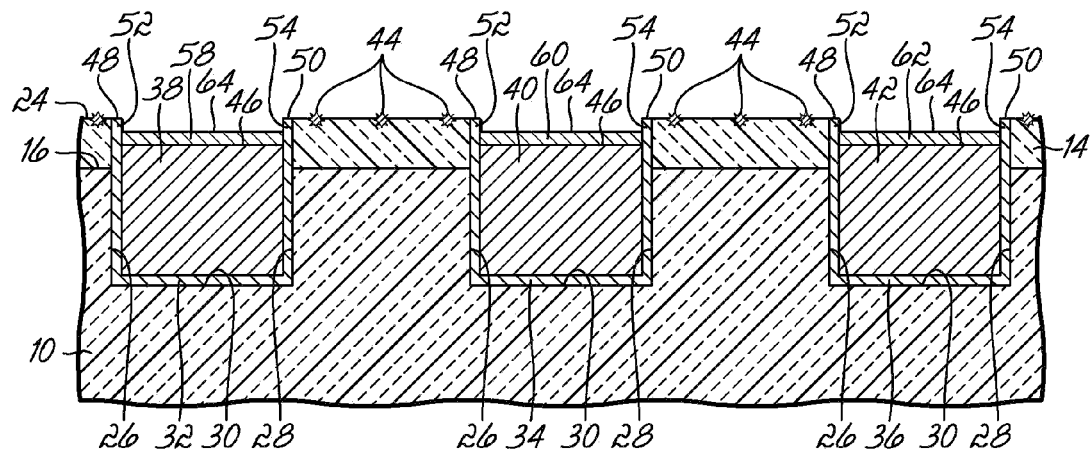
FIGS. 7 and 8 are diagrammatic cross-sectional views of a portion of a substrate at successive fabrication stages subsequent to FIG. 4 of a processing method in accordance with an alternative embodiment of the invention.

With reference to FIG. 7 in which like reference numerals refer to like features in FIG. 4 and at a subsequent fabrication stage in accordance with an alternative embodiment of the invention, the conductive lines 38, 40, 42 are capped with a respective one of capping layers 58, 60, 62, which are composed of an electrically conductive material. The electrically conductive material constituting the capping layers 58, 60, 62 may be deposited by a selective deposition process that deposits the electrically conductive material onto the capping layers 58, 60, 62, but fails to deposit the electrically conductive material on non-conductive material containing areas, such as the top surface 16 of insulating layer 10. The thickness of the capping layers 58, 60, 62 is specified such that a top surface 64 of each capping layers 58, 60, 62 is positioned below the corresponding top edges 48, 50 of the sidewall portions 52, 54 of a respective one of the liner layers 32, 34, 36. The capping layers 58, 60, 62 are also bounded spatially in a horizontal direction between the sidewall portions 52, 54 of the respective one of the liner layers 32, 34, 36.

The electrically conductive material constituting the capping layers 58, 60, 62 may comprise a metal, such as a cobalt-containing material containing elemental cobalt (Co) with or without incidental impurities, or cobalt in combination with one or more of the elements tungsten (W), phosphorus (P), boron (B), tin (Sn), molybdenum (Mo), ruthenium (Ru), or another suitable element as an alloy, dopant or non-equilibrium mixture. The microstructural morphology of the metal constituting the capping layers 58, 60, 62 may be amorphous or polycrystalline. The capping layers 58, 60, 62 may be deposited by any well known selective deposition process, such as a wet electroless or electroplating process. Electroless or electroplating deposition selectively forms a thin metal film on surfaces wetted by an aqueous solution by reducing a complex metal ion contained in the aqueous solution. The thin metal film does not form on non-metallic surfaces, such as the top surface 24 of sacrificial layer 14.

Figure 8:
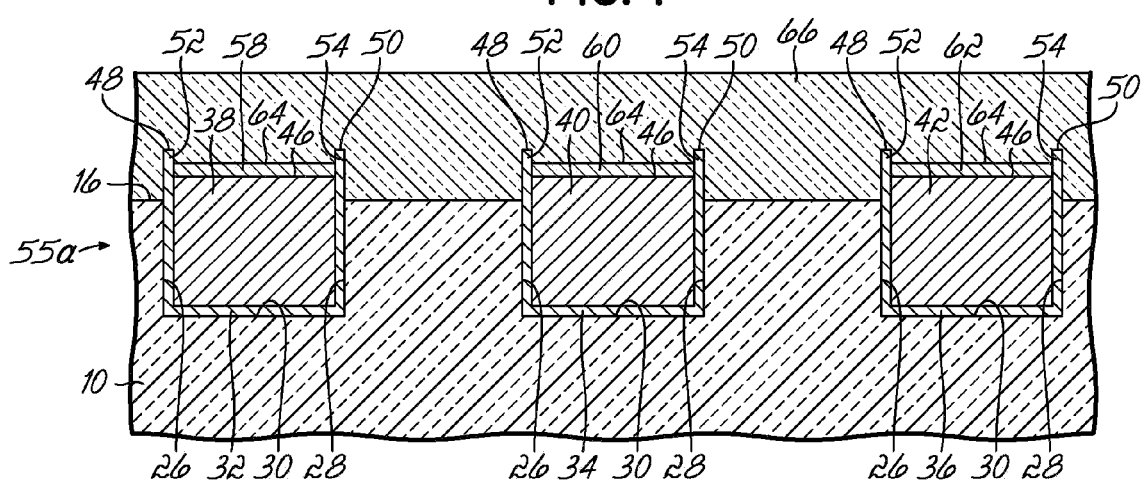

With reference to FIG. 8 in which like reference numerals refer to like features in FIG. 7 and at a subsequent fabrication stage, the sacrificial layer 14 is removed, as described above with regard to FIG. 5, selective to the material(s) of the liner layers 32, 34, 36 and capping layers 58, 60, 62 to define an interconnect level, which is generally indicated by reference numeral 55$a$ and is otherwise similar to interconnect level 55 (FIG. 6). Another insulating layer 66 of dielectric material is subsequently deposited that covers the top surface 16 of the insulating layer 10 and the top surface 64 of each of the capping layers 58, 60, 62. The electromigration resistance of the conductive lines 38, 40, 42 is increased by the cooperation between the capping layers 58, 60, 62 and the projection of the top edges 48, 50 of the sidewall portions 52, 54 of each of the liner layers 32, 34, 36 above the top surface 16 of insulating layer 10 and above the top surface 46 of the conductive lines 38, 40, 42.

Figure 9:
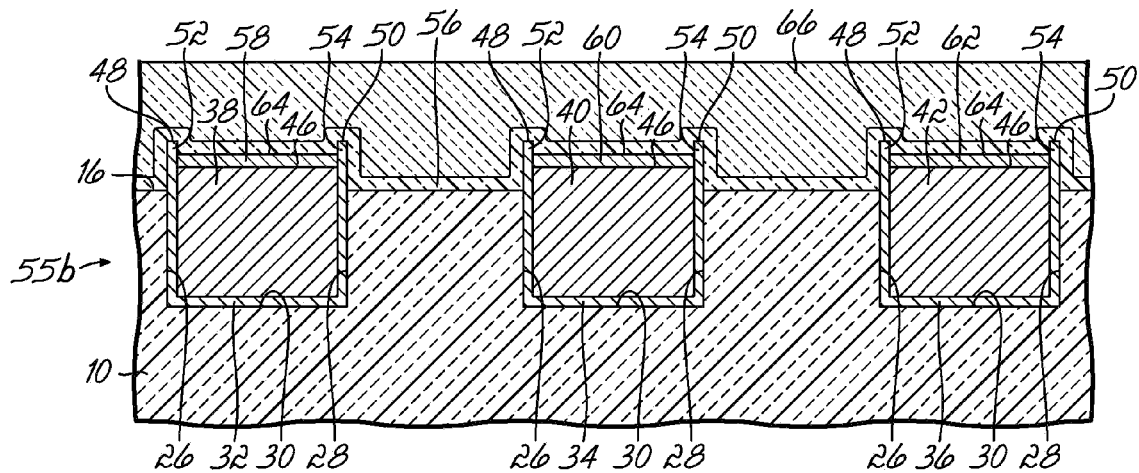
FIG. 9 is a diagrammatic cross-sectional view of a portion of a substrate at a fabrication stage subsequent to FIG. 8 of a processing method in accordance with an alternative embodiment of the invention.

With reference to FIG. 9 in which like reference numerals refer to like features in FIG. 7 and at a subsequent fabrication stage in accordance with an alternative embodiment of the invention, an interconnect level 55$b$, which is generally indicated by reference numeral 55$a$ and is otherwise similar to interconnect level 55$b$ (FIG. 8), further includes a conformal capping layer 56, which is applied as described above with regard to FIG. 6. The conformal capping layer 56 further cooperates with capping layers 58, 60, 62 and the projection of the top edges 48, 50 of the sidewall portions 52, 54 of each of the liner layers 32, 34, 36 above the top surface 16 of insulating layer 10 and the top surface 46 of the conductive lines 38, 40, 42 to increase the electromigration resistance of the conductive lines 38, 40, 42. The conformal capping layer 56 is subsequently covered by the insulating layer 66 of dielectric material.

Figure 10:
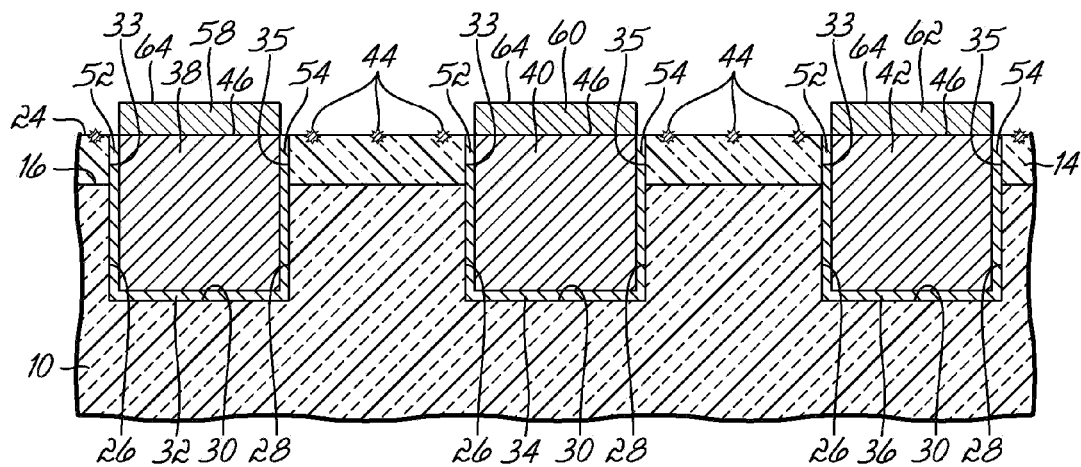
FIGS. 10-12 are diagrammatic cross-sectional views of a portion of a substrate at successive fabrication stages subsequent to FIG. 3 of a processing method in accordance with an alternative embodiment of the invention.

With reference to FIG. 10 in which like reference numerals refer to like features in FIG. 3 and at a subsequent fabrication stage in accordance with an alternative embodiment of the invention, capping layers 58, 60, 62 are formed on the top surface 64 of a respective one of the conductive lines 38, 40, 42, as described above with regard to FIG. 7. Because the top surface 46 of each of the conductive lines 38, 40, 42 is not recessed relative to the top surface 24 of sacrificial layer 14 before forming the capping layers 58, 60, 62, the top surface 64 of each of the capping layers 58, 60, 62 projects above the height of the top edges 48, 50 of the sidewall portions 52, 54 of the respective one of the liner layers 32, 34, 36.

Figure 11:
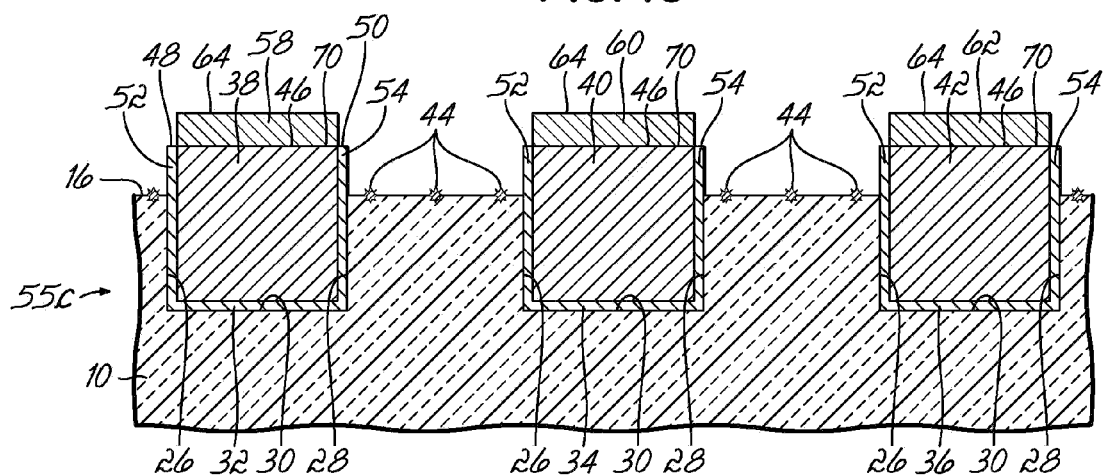

With reference to FIG. 11 in which like reference numerals refer to like features in FIG. 10 and at a subsequent fabrication stage, the sacrificial layer 14 is removed using an etching process, as described above with regard to FIG. 5, to define an interconnect level, generally indicated by reference numeral 55c and otherwise similar to interconnect level 55 (FIG. 6). The capping layers 58, 60, 62 may operate as a etch mask for the conductive lines 38, 40, 42 during the etching process. After the sacrificial layer 14 is removed, the top edges 48, 50 of the sidewall portions 52, 54 of each of the liner layers 32, 34, 36 project above the top surface 16 of insulating layer 10, but not above the top surface 46 of each of the conductive lines 38, 40, 42. The etching process may recess the residual amounts 44 of the conductor used to form the conductive lines 38, 40, 42 by a snowplowing effect. An interface 70 with an open or uncovered perimeter is present between each of the conductive lines 38, 40, 42 and the corresponding one of the capping layers 58, 60, 62 because the top edges 48, 50 of the sidewall portions 52, 54 of liner layers 32, 34, 36 fail to project above the top surface 46 of each of the conductive lines 38, 40, 42.

Figure 12:
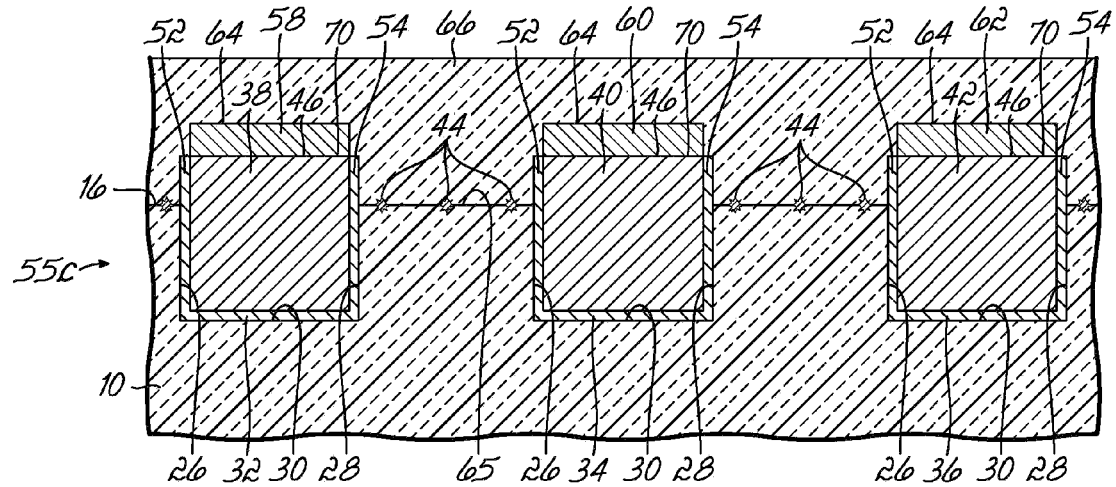

With reference to FIG. 12 in which like reference numerals refer to like features in FIG. 11 and at a subsequent fabrication stage, an insulating layer 66 is applied to the top surface 16 of the insulating layer 10 of interconnect level 69. The insulating layer 66 covers the top surface 64 of each of the capping layers 58, 60, 62. The insulating layer 66, which may be formed from the same types of dielectric material as insulating layer 10, may participate in forming an overlying interconnect level. Residual amounts 44 of the conductor used to form the conductive lines 38, 40, 42 are trapped along the interface 65 between the insulating layers 10, 66.

Figure 13:
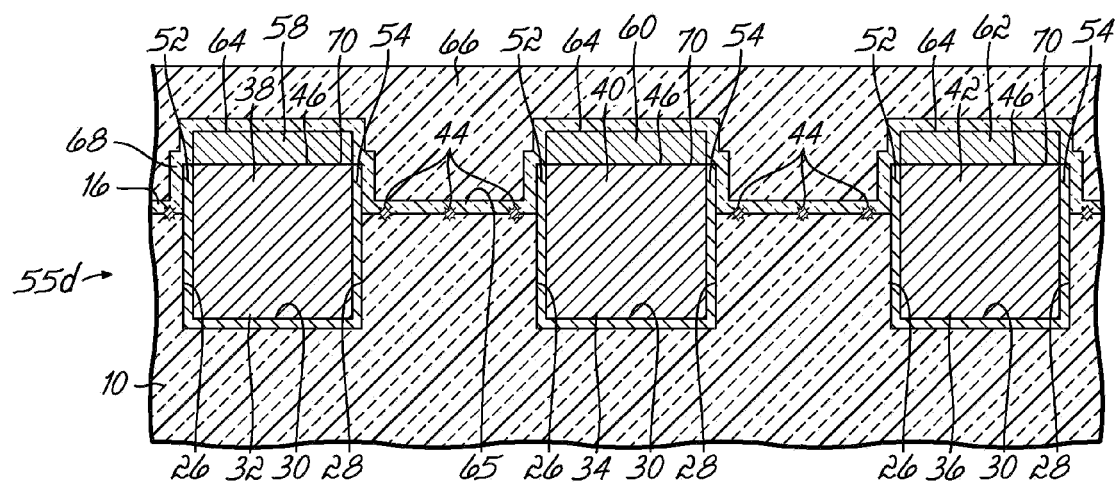
FIG. 13 is a diagrammatic cross-sectional view of a portion of a substrate at a fabrication stage subsequent to FIG. 11 of a processing method in accordance with an alternative embodiment of the invention.

With reference to FIG. 13 in which like reference numerals refer to like features in FIG. 11 and at a subsequent fabrication stage in accordance with an alternative embodiment of the invention, an interconnect level, which is generally indicated by reference numeral 55d and otherwise similar to interconnect lever 55c (FIGS. 11, 12), further includes a conformal capping layer 68. The conformal capping layer 68 is deposited, before the insulating layer 66 is applied, on the top surface 16 of insulating layer 10 and the top surface 64 of each of the capping layers 58, 60, 62. The conformal capping layer 68 has a construction similar to the conformal capping layer 56 described with regard to FIG. 6. The capping layer 68 seals the interface 70 between each of the conductive lines 38, 40, 42 and the respective one of the capping layers 58, 60, 62.

In alternative embodiments of the invention, the sacrificial layer 14 may be omitted in its entirety. The conductive lines 38, 40, 42 may be polished to approximately the top surface 16 of insulating layer 10 before the capping layers 58, 60, 62 are formed on the top surface the conductive lines 38, 40, 42 and the top surface 16 of the insulating layer 10 is recessed.

The embodiments of the invention provide interconnect structures with high dielectric breakdown resistance and with excellent potential for future technology extendibility. The invention in its various embodiments provides fabrication methods that are compatible with BEOL process flows without introducing additional masking steps or incrementally added cost.

Figure 14:
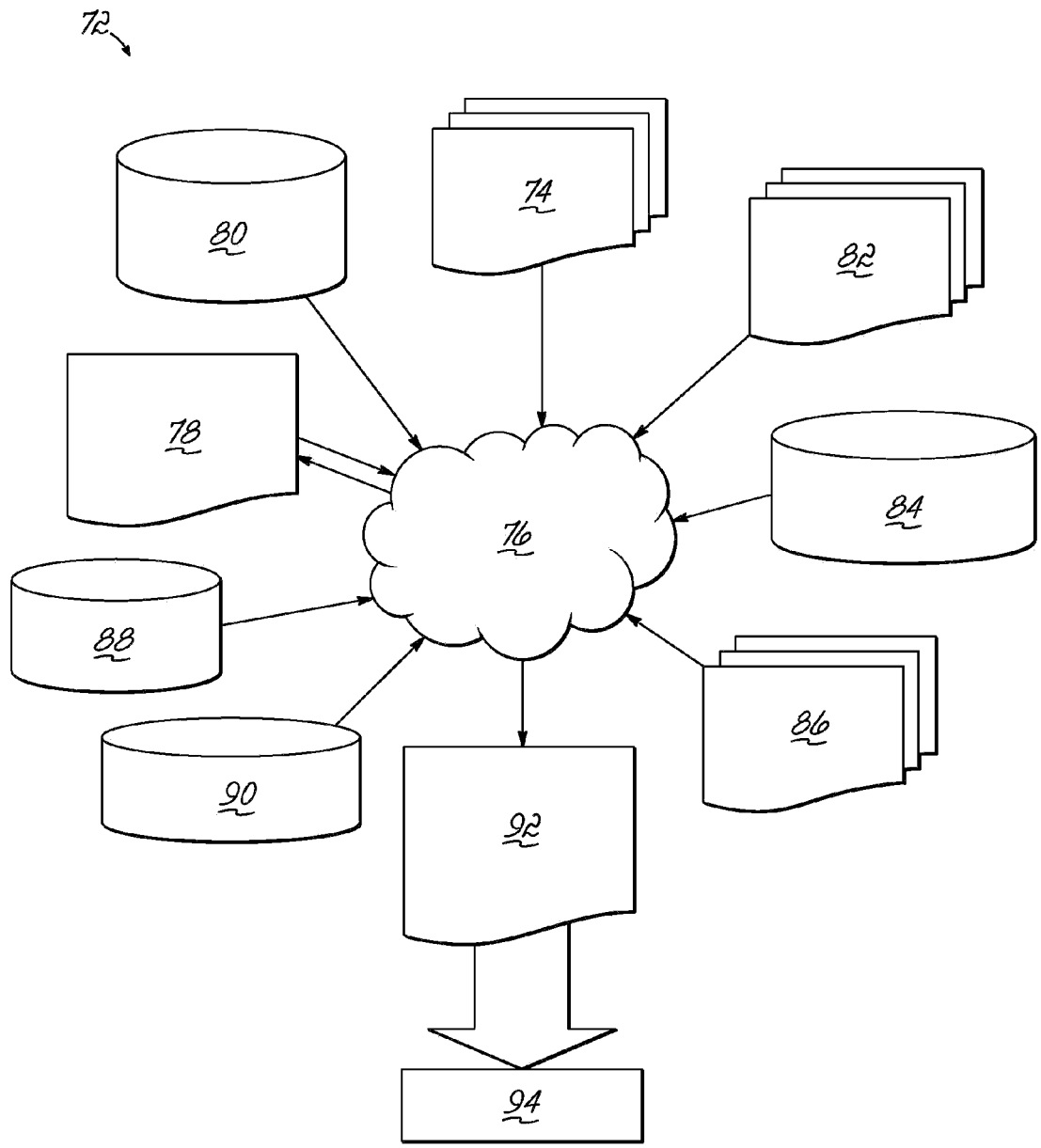
FIG. 14 is a flow diagram of a design process used in semiconductor design, manufacturing, and/or test.

FIG. 14 shows a block diagram of an example design flow 72. Design flow 72 may vary depending on the type of integrated circuit (IC) being designed. For example, a design flow 72 for building an application specific IC (ASIC) may differ from a design flow 72 for designing a standard component. Design structure 74 is preferably an input to a design process 76 and may come from an IP provider, a core developer, or other design company, or may be generated by the operator of the design flow 72, or from other sources. Design structure 74 comprises a circuit incorporating at least one of the interconnect levels 55 and 55a-d in the form of schematics or HDL, a hardware-description language (e.g., Verilog, VHDL, C, etc.). Design structure 74 may be contained on one or more machine readable medium. For example, design structure 74 may be a text file or a graphical representation of the circuit. Design process 76 preferably synthesizes (or translates) the circuit into a netlist 78, where netlist 78 is, for example, a list of wires, transistors, logic gates, control circuits, I/O, models, etc. that describes the connections to other elements and circuits in an integrated circuit design and recorded on at least one of machine readable medium. This may be an iterative process in which netlist 78 is resynthesized one or more times depending on design specifications and parameters for the circuit.

Design process 76 may include using a variety of inputs; for example, inputs from library elements 80 which may house a set of commonly used elements, circuits, and devices, including models, layouts, and symbolic representations, for a given manufacturing technology (e.g., different technology nodes, 32 nm, 45 nm, 90 nm, etc.), design specifications 82, characterization data 84, verification data 86, design rules 88, and test data files 90 (which may include test patterns and other testing information). Design process 76 may further include, for example, standard circuit design processes such as timing analysis, verification, design rule checking, place and route operations, etc. A person having ordinary skill in the art of integrated circuit design can appreciate the extent of possible electronic design automation tools and applications used in design process 76 without deviating from the scope and spirit of the invention. The design structure of the invention is not limited to any specific design flow.

Design process 76 preferably translates at least one embodiment of the invention as shown in FIGS. 6, 8, 9, 12, and 13, along with any additional integrated circuit design or data (if applicable), into a second design structure 92. Design structure 92 resides on a storage medium in a data format used for the exchange of layout data of integrated circuits (e.g. information stored in a GDSII (GDS2), GL1, OASIS, or any other suitable format for storing such design structures). Design structure 92 may comprise information such as, for example, test data files, design content files, manufacturing data, layout parameters, wires, levels of metal, vias, shapes, data for routing through the manufacturing line, and any other data required by a semiconductor manufacturer to produce at least one embodiment of the invention as shown in FIGS. 6, 8, 9, 12, and 13. Design structure 92 may then proceed to a stage 94 where, for example, design structure 92: proceeds to tapeout, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor wafer or substrate, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the invention without departing from the spirit and scope of the invention. The term "on" used in the context of two layers means at least some contact between the layers. The term "over" means two layers that are in close proximity, but possibly with one or more additional intervening layers such that contact is possible but not required. As used herein, neither "on" nor "over" implies any directionality.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the invention. It is also understood that features of the invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A hardware description language (HDL) design structure encoded on a non-transitory machine-readable storage medium, said HDL design structure comprising elements that when processed in a computer-aided design system generates a machine-executable representation of an interconnect level in a back-end-of-line interconnect structure, the HDL design structure comprising:
    an insulating layer of a dielectric material having a top surface and a bottom surface;
    an opening having sidewalls extending from the top surface of the insulating layer toward the bottom surface of the insulating layer;
    a conductive feature disposed in the opening, the conductive feature having a top surface;
    a conductive liner layer disposed between the insulating layer and the conductive feature along at least the sidewalls of the opening, the conductive liner layer having sidewall portions that project above the top surface of the insulating layer adjacent to the sidewalls of the opening; and
    a conformal dielectric material layer disposed on the sidewall portions of the liner layer, the top surface of the conductive feature, and the insulating layer.

2. The HDL design structure of claim 1 wherein the HDL design structure comprises a netlist, which describes an integrated circuit.

3. The HDL design structure of claim 1 wherein the HDL design structure resides on the non-transitory machine-readable storage medium as a data format used for the exchange of layout data of integrated circuits.

4. The HDL design structure of claim 1 wherein the HDL design structure includes at least one of test data files, characterization data, verification data, or design specifications.

5. The HDL design structure of claim 1 wherein the insulating layer comprises a dielectric material having a dielectric constant of about 3.0 or less.

6. The HDL design structure of claim 1 further comprising:
    a first capping layer disposed between the conductive feature and the conformal dielectric layer, the first capping layer and the conductive feature composed of different conductive materials.

7. The HDL design structure of claim 6 wherein the conductive material of the first capping layer composed of elemental cobalt, or cobalt and at least one element selected from the group consisting of tungsten, phosphorus, boron, tin, and molybdenum, and the conductive material of the conductive feature is composed of copper.

8. The HDL design structure of claim 1 further comprising:
    a first capping layer composed of a conductor bounded by the sidewall portions of the liner layer and disposed on the top surface of the conductive feature, the first capping layer disposed between the conductive feature and the conformal dielectric layer.

9. The HDL design structure of claim 8 wherein the insulating layer comprises a dielectric material having a dielectric constant of about 3.0 or less and the dielectric material of the conformal dielectric layer is composed of $Si_3N_4$, SiC, or SiC(N,H).

10. The HDL design structure of claim 8 wherein the sidewall portions of the liner layer project above the top surface of the conductive feature.

11. The HDL design structure of claim 1 wherein the insulating layer is composed of a dielectric material of has a dielectric constant of about 3.0 or less and the conformal dielectric layer comprises $Si_3N_4$, SiC, or SiC(N,H).

12. The HDL design structure of claim 1 wherein the sidewall portions of the liner layer project above the top surface of the conductive feature.

13. The HDL design structure of claim 11 wherein the sidewall portions of the liner layer project above the top surface of the conductive feature by a height between about 0.5 nm and about 50 nm.

14. A hardware description language (HDL) design structure encoded on a non-transitory machine-readable storage medium, said HDL design structure comprising elements that when processed in a computer-aided design system generates a machine-executable representation of an interconnect level in a back-end-of-line interconnect structure, the HDL design structure comprising:
    an insulating layer of a dielectric material having a top surface and a bottom surface;
    an opening having sidewalls extending from the top surface of the insulating layer toward the bottom surface of the insulating layer;

a conductive feature disposed in the opening, the conductive feature having a top surface;

a conductive liner layer disposed between the insulating layer and the conductive feature along at least the sidewalls of the opening, the conductive liner layer having sidewall portions that project above the top surface of the insulating layer adjacent to the sidewalls of the opening;

a conductive capping layer on the top surface of the conductive feature, the conductive capping layer composed of a cobalt-containing material; and a conformal dielectric material layer disposed on the sidewall portions of the liner layer, a top surface of the conductive capping layer, and the insulating layer.

15. The HDL design structure of claim 14 wherein the HDL design structure comprises a netlist, which describes an integrated circuit.

16. The HDL design structure of claim 14 wherein the HDL design structure resides on the non-transitory machine-readable storage medium as a data format used for the exchange of layout data of integrated circuits.

17. The HDL design structure of claim 14 wherein the HDL design structure includes at least one of test data files, characterization data, verification data, or design specifications.

18. The HDL design structure of claim 14 wherein the cobalt-containing material is composed of elemental cobalt, or cobalt and at least one element selected from the group consisting of tungsten, phosphorus, boron, tin, and molybdenum, and the conductive feature is composed of copper.

* * * * *